US010972074B2

(12) United States Patent
Berglund et al.

(10) Patent No.: US 10,972,074 B2
(45) Date of Patent: Apr. 6, 2021

(54) SOLID STATE RELAY

(71) Applicant: NEXPERIA B.V., Nijmegen (NL)

(72) Inventors: Stefan Berglund, Eindhoven (NL);
Soenke Habenicht, Eindhoven (NL);
Michael Felix Konejung, Eindhoven
(NL); Joachim Stange, Eindhoven
(NL); Seong-Woo Bae, Eindhoven (NL)

(73) Assignee: Nexperia B.V., Nijmegen (NL)

( * ) Notice: Subject to any disclaimer, the term of this patent is extended or adjusted under 35 U.S.C. 154(b) by 77 days.

(21) Appl. No.: 15/487,206

(22) Filed: Apr. 13, 2017

(65) Prior Publication Data
US 2017/0302255 A1    Oct. 19, 2017

(30) Foreign Application Priority Data

Apr. 14, 2016  (EP) .................................... 16165447

(51) Int. Cl.
*H03K 3/012* (2006.01)
*H03K 17/60* (2006.01)
*H03K 3/017* (2006.01)
*H03K 17/16* (2006.01)
*H03K 17/0812* (2006.01)

(52) U.S. Cl.
CPC ............ *H03K 3/012* (2013.01); *H03K 3/017*
(2013.01); *H03K 17/602* (2013.01); *H03K 17/08126* (2013.01); *H03K 17/16* (2013.01)

(58) Field of Classification Search
CPC ....... H03K 17/08122; H03K 17/08126; H03K 17/16; H03K 17/602; H03K 3/012; H03K 3/017
See application file for complete search history.

(56) References Cited

U.S. PATENT DOCUMENTS 3,486,045 A * 12/1969 Frick ...................... H03K 17/08
327/530
3,978,350 A 8/1976 Fletcher et al.
5,684,427 A 11/1997 Stoddard et al.
(Continued)

FOREIGN PATENT DOCUMENTS

| EP | 0 287 525 A2 | 10/1988 |
| JP | 2009-55549 A | 3/2009 |
| WO | WO 90/10967 A1 | 9/1990 |

OTHER PUBLICATIONS

Lesurf, Jim; "Differential Amplifiers and Current Sources", May 18, 2000, pp. 1-5, XP055308793, St. Andrews, Fife KY16 9SS, Scotland Retrieved from the Internet: URL:https://www.st-andrews.ac.uk/~www.pa/Scots_Guide/audio/part1/page3.html [retrieved on Oct. 7, 2016].

(Continued)

*Primary Examiner* — Diana J. Cheng
(74) *Attorney, Agent, or Firm* — Ohlandt, Greeley, Ruggiero & Perle, LLP

(57) ABSTRACT

The disclosure relates to solid state relay circuit for switching an electrical load. The solid state relay circuit may include a relay transistor; and a driver circuit comprising a constant current source. The driver circuit is configured and arranged to switchably operate the relay transistor, and the relay transistor is configured and arranged to switchably operate the electrical load.

19 Claims, 5 Drawing Sheets

(56) References Cited

U.S. PATENT DOCUMENTS

| | | | | |
|---|---|---|---|---|
| 5,952,864 A | * | 9/1999 | Deckers | H03F 1/302 327/313 |
| 2008/0197904 A1 | * | 8/2008 | Bolz | H03K 17/6871 327/180 |
| 2017/0201086 A1 | * | 7/2017 | Chen | H02H 3/08 |

OTHER PUBLICATIONS

European Search Report dated Oct. 18, 2016 from corresponding European Patent Application No. 16165447.0, 10 pages.

* cited by examiner

SOLID STATE RELAY

CROSS REFERENCE TO RELATED APPLICATIONS

The present application claims foreign priority to European Patent Application No. 16165447.0 filed on Apr. 14, 2016, the entirety of which is incorporated by reference hereby.

FIELD OF THE INVENTION

The present disclosure relates to a solid state relay circuit for switching an electrical load. The disclosure also relates to switching circuit comprising the solid state relay circuit.

Electro-mechanical relays are commonly used to drive electrical loads, for example electric motors, lighting systems such as LEDs, or power distributers. Electro-mechanical relays may be used in diverse applications from automotive engine control to railway signalling. In applications where safety is critical, the electro-mechanical relays must be very reliable. However, due to the mechanical nature of these devices, moving parts such as the relay armature may become damaged during use. Furthermore, due to their mechanical nature electro-mechanical relays have low switching speeds as a result of the required mechanical movement of the armature. Furthermore electro-mechanical relays have poor electromagnetic compatibility (EMC) behaviour due to unwanted electromagnetic interference (EMI) which may degrade over time as mechanical parts degrade. There is therefore a trend to replace electro-mechanical relays with semiconductor based solid state relays and there is a further trend for retro fitting solid state relays where electro-mechanical relays were previously used Known types of solid state relays may comprise a low current control and a high current load, which are isolated optically. However, optical isolation requires the use of opto-couplers which significantly increases the cost of such relays when compared to traditional electro-mechanical relays.

SUMMARY OF INVENTION

According to an embodiment there is provided solid state relay circuit for switching an electrical load, the solid state relay circuit comprising: a relay transistor; and a driver circuit comprising a constant current source; wherein the driver circuit is configured and arranged to switchably operate the relay transistor, and wherein the relay transistor is configured and arranged to switchably operate the electrical load.

The constant current source may comprise a driver transistor; a first resistor connected to a input terminal of the driver transistor; and at least one diode connected to a control terminal of the driver transistor; wherein the diode and the driver transistor are arranged to produce a constant voltage across the first resistor and wherein the driver transistor output terminal is directly connected a control terminal of the relay transistor and arranged to switchably operate the relay transistor.

The constant current source may further comprise a balancing resistor connected between the output terminal of driver transistor and a control terminal of relay transistor.

The input terminal of the driver transistor may be an emitter terminal; the control terminal of the driver transistor may be a base terminal; the output terminal of driver transistor may be a collector terminal; and the control terminal of relay transistor may a base terminal.

The input terminal of the driver transistor may be a collector terminal; the control terminal of the driver transistor may be a base terminal; the output terminal of driver transistor may be an emitter terminal and the control terminal of relay transistor may be a base terminal.

The driver transistor may be pnp transistor and the relay transistor may be npn transistor. The driver transistor may be a pnp transistor and the relay transistor may be a pnp transistor. The driver transistor may be npn transistor and the relay transistor may be a npn transistor. The driver transistor may be an npn transistor and the relay transistor may be a pnp transistor.

The driver transistor may be a low power transistor and the relay transistor may be a high power transistor.

The constant current source may further comprise a second resistor configured allow the diodes to conduct and to provide base current to the driver transistor.

An enable line may be configured and arranged to switchably control the driver circuit. A switch may be configured and arranged to switchably control the driver circuit. The switch or the enable line may be controlled by a pulse width modulation circuit. The switch or the enable line may be switchably connected to the control terminal of the driver transistor.

DESCRIPTION OF THE DRAWINGS

In the figures and the following description like reference numerals refer to like features.

The invention is described further hereinafter by way of example only with reference to the accompanying drawings in which.

Figure 1:
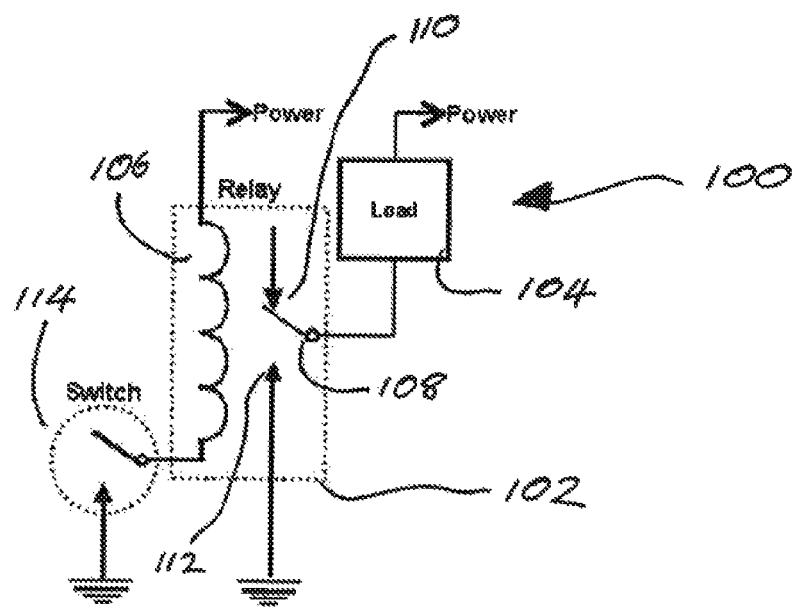
FIG. 1 shows a circuit diagram of a low side relay circuit.
Figure 2:
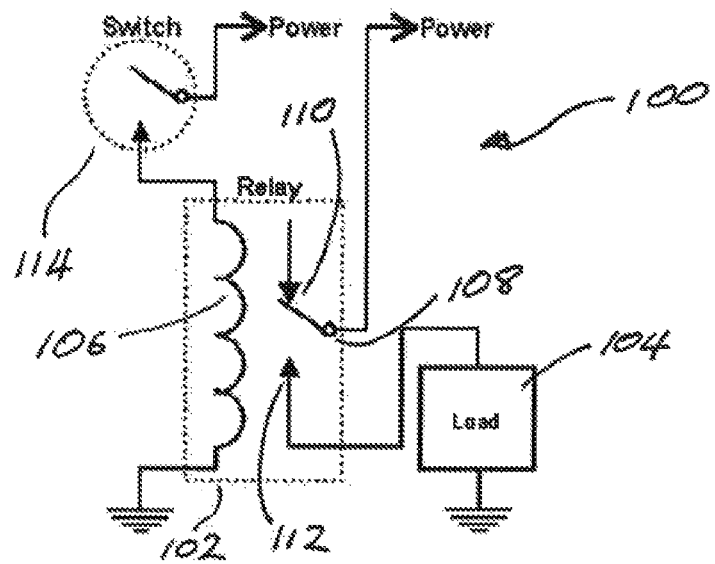
FIG. 2 shows a circuit diagram of a high side relay circuit.

A known low side switching electro-mechanical relay circuit 100 is shown in FIG. 1. The relay circuit 100 comprises an electromechanical relay 102 which switchably controls a load 104 connected to a power line. The relay 102 comprises an electrical wire coil 106 and a switchable armature 108 which is movable between first and second relay contacts 110, 112. A switch 114 is operable to allow a current to flow from a power line to ground through the coil 106 and when this current flows the relay 102 operates to move the armature 108 between the first and second relay contacts so as to connect the load between the power line and ground, thereby switchably operating the load 104. This relay circuit 100 is known as a "low side" circuit because of the arrangement of the switchable armature 108 of the relay 102 between the load 104 and ground. Conversely, a known high side switching electro-mechanical relay circuit 100' is illustrated in FIG. 2, in which like reference numerals refer to like features of FIG. 1. The circuit of FIG. 2 is a "high side" circuit because of arrangement of the switchable armature 108 of the relay 102 between the load 104 and the power line. The electromechanical relay 102 of FIGS. 1 and 2 are switchably controlled by the current flowing from the power line to ground through the coil when the switch 114 is on. The switching of the relay thus controls the operation of the load 104.

Figure 3:
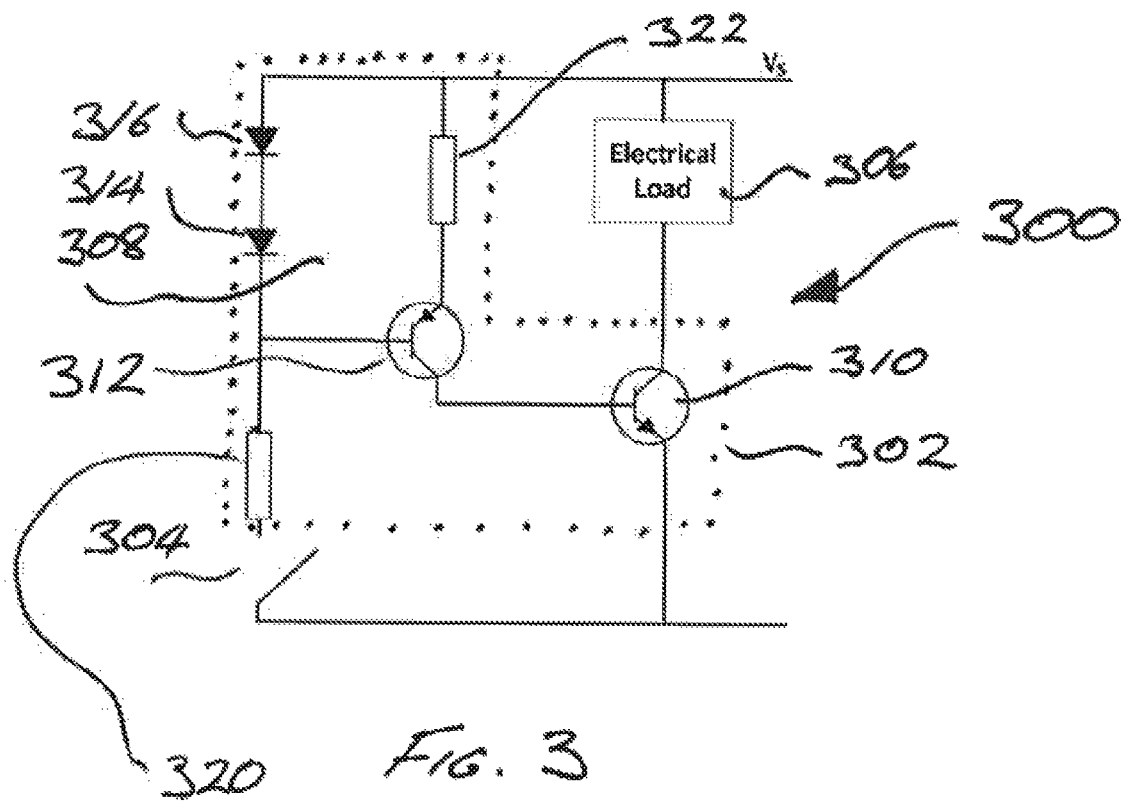
FIG. 3 illustrates a circuit diagram according to an embodiment of a low side solid state relay circuit using a constant current source.

FIG. 3 illustrates a circuit diagram of a switching circuit 300. The switching circuit 300 may comprise a solid state relay circuit 302 according to an embodiment, a switch 304 and an electrical load 306 to be switchably controlled. The electrical load 306 may be switchably controlled by the solid state relay circuit 302. The solid state relay circuit 302 may comprise a driver circuit 308, where the driver circuit 308 may be arranged to switchably operate a relay transistor 310. The electrical load 306 and the switching circuit 302 may be powered through a voltage supply line Vs.

The driver circuit 308 may be a constant current source. The driver circuit 308 may comprise a driver transistor 312 arranged to switchably operate the relay transistor 310 in response to the switch 304 being turned on. The driver circuit 308 may further comprise first and second diodes 314, 316 and first and second resistors 322, 320. The first and second diodes 314, 316 may be connected in series forward bias between the voltage supply line Vs and a base of the driver transistor 312. The first resistor 322 is connected between the emitter of the driver transistor 312 and the voltage supply line Vs. The relay transistor 310 may be an npn transistor and the driver transistor 312 may be a pnp transistor. The switch 304 may be switchably connected between ground and the second resistor 320.

The second resistor 320 may be connected between the base of the driver transistor 312 and a terminal of the switch 304. This second resistor 320 allows an appropriate current to flow from the voltage supply line Vs to ground thereby providing a base current to the driver transistor 312. The resistance of the second resistor 320 may be chosen so as to keep the leakage current from the voltage supply line Vs to ground low, typically in the order of 2 mA, whilst at the same time allowing the first and second diodes 314 and 316 to conduct. The voltage drop across the second resistor should such to allow the first and second diodes 314 and 316 to conduct. In this regard the second resistor 320 sets the operating conditions for the two diodes 314 and 316, but also limits any leakage currents from voltage source line Vs to ground. Each of the diodes 314 and 316 exhibit a forward voltage drop Vf. The combined forward voltage drop of the diodes 314 and 316, minus a base-emitter voltage Vbe of the pnp driver transistor 312 produce a constant voltage across the first resistor 322, thus producing a constant current on the base of the relay transistor 310.

Hence the choice of second resistor 320 is a trade-off between minimising leakage current and providing a current that is sufficient current to switch the driver transistor 312 of the driver circuit 308 at low (for example 6 to 16.8 volts in automotive applications) supply voltage at the voltage supply line Vs.

The switch 304 may be any appropriate switch arranged to switchably operate the solid state relay circuit 302. For example the switch 304 may form part of an external control circuit (not illustrated). The electrical load 306 may be connected between a collector of the relay transistor 310 and the voltage supply line Vs. The emitter of the relay transistor 310 may be connected to ground. This arrangement of the electrical load 306 with respect to the relay transistor 310 and the voltage supply line Vs may be seen as a "low side" configuration. For example, during operation, the supply voltage on the voltage supply line Vs may be between 6 volts and 16.8 volts. This supply voltage range is typical for automotive applications. However, the skilled person will appreciate that operating principles apply for any supply voltage.

A collector of the driver transistor 312, which acts as an output of the driver circuit 308 may be connected to the base of the relay transistor 310. An emitter of the driver transistor may act as an input terminal of the driver transistor and a base of the driver transistor may act as a control terminal. The base of the relay transistor 310 may be seen as an input of the relay transistor 310. In this embodiment the output of the driver circuit 308 may be a collector of the driver transistor 312 and may be directly connected to the base of the relay transistor 310, that is, without any intermediate components or devices there between.

The skilled person will appreciate that whilst the above embodiment utilises two diodes, the embodiment may be implemented with one or more diodes provided that the necessary voltage drop is achieved.

In operation the driver circuit 308 switchably operates the relay transistor 310 in response to the operation of the switch 304. When the switch 304 is turned on, so as to connect the second resistor 320 to ground, the driver circuit 308 will operate so as to provide a constant current to the base of the relay transistor 310. Each of the diodes 314 and 316 exhibit a forward voltage drop. The combined forward voltage drop of the diodes 314 and 316, minus a base-emitter voltage (Vbe) of the pnp driver transistor 312 produces a constant voltage across the first resistor 322, thus driving a constant current on the base of the relay transistor 310.

In this regard, the driver transistor 312 is switched on and a current flows from the voltage supply line Vs through the driver transistor 312 to the base of the relay transistor 310, thus turning on the relay transistor 310. As a result of the relay transistor turning on a current flows from the voltage supply through the relay transistor 310 to ground such that the load is turned on. In this way the load 306 is switchably operated by the relay transistor 310 in response to the operation of the driver circuit 308.

As a result, the switch 304 operates using a relatively low current in the driver circuit 308 to control a relatively larger current of the load 306, by switchably operating the relay transistor 310. In this regard the skilled person will see that the driver transistor 312 may be rated to a relatively lower operating power than the relay transistor 310.

As mentioned the switch 304 may be any appropriate switching means or control circuit. For example the switch may be a transistor controlled by the output of a pulse width modulation (PWM) circuit. In this way the application of a modulated signal to the switch may result in pulse width modulation of the electrical load 306 via the driver circuit 308 and the relay transistor 310. The skilled person will appreciate that the switching response time of the solid state relay circuit 300 may be much greater than that of a conventional electro-mechanical relay because here are no mechanical movements required to switch the load.

During operation, the power dissipation of the relay transistor 310 is controlled by the driver circuit 308. Due to the voltage drop across the diodes 314, 316 and the base-collector voltage drop of the driver transistor 312, the base of the relay transistor 310 is typically less than 2 volts above ground. As a result the remaining power dissipation from the voltage supply Vs is a product of base current of the relay transistor 310 produced in the driver circuit 308. Where the supply voltage is in the range of 6 volts to 16.8 volts the power dissipation of the base current for the relay transistor 310 may cause unwanted thermal heating. This may potentially cause thermal damage to the relay transistor 310.

Furthermore, where the components are integrated on a single die this heating may cause thermal damage to surrounding components.

However, since the combined voltage drop of the series connected first and second diodes 314, 316 and the base emitter voltage of the driver transistor 312 has a negative thermal coefficient, the output current of the driver circuit 308 may reduce as the temperature rises. As a result of this temperature rise the base current for the relay transistor 310 (that is the output current of the driver transistor 312) will be reduced and may reduce to such an extent that the relay transistor 310 and thus the load may fail to operate.

Figure 4:
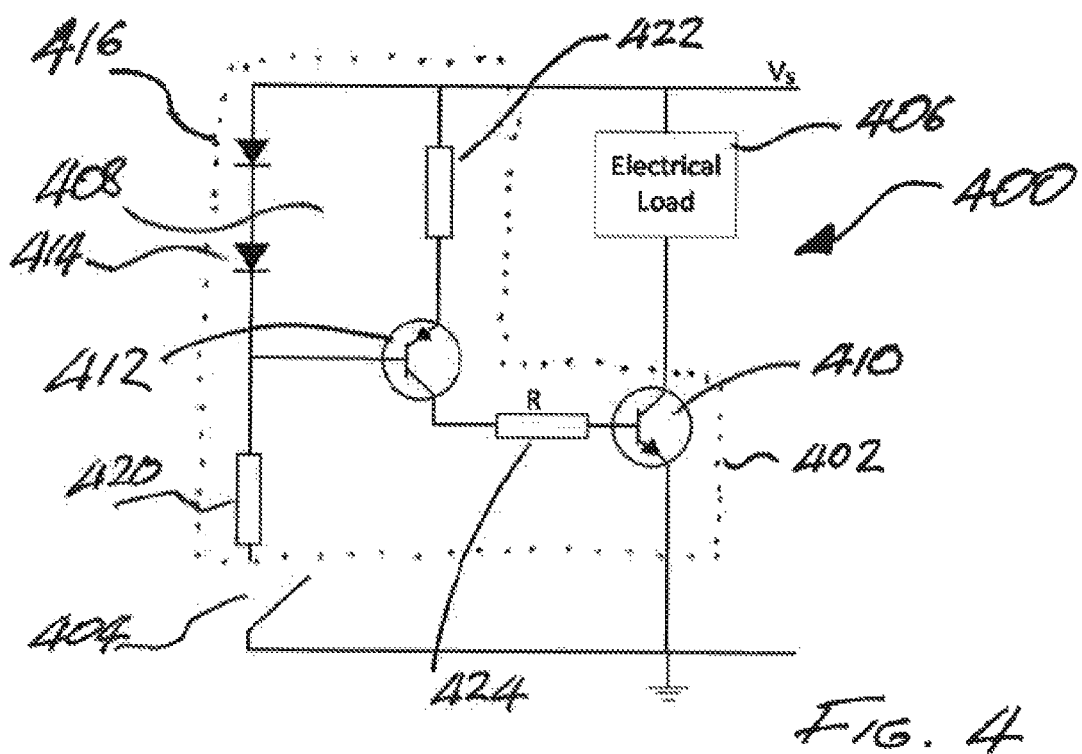
FIG. 4 illustrates a circuit diagram according to an embodiment of a low side solid state relay circuit using a constant current source.

FIG. 4 illustrates circuit diagram of a switching circuit 400. As with the embodiment of FIG. 3, the switching circuit 400 may comprise a solid state relay 402 according to an embodiment, a switch 404 and an electrical load 406 to be switchably controlled. The electrical load 406 may be switchably controlled by the solid state relay circuit 402. The solid state relay circuit 402 may comprise a driver circuit 408, where the driver circuit may be arranged to switchably operate a relay transistor 410. The electrical load 406 and the solid state relay 402 may be powered by a voltage supply line Vs.

As with the circuit of FIG. 3, the driver circuit 408 of FIG. 4 may be a constant current source. The driver circuit 408 may comprise a driver transistor 412 arranged to switchably operate the relay transistor 410 in response to the switch 404 being turned on. The driver circuit 408 may further comprise first and second diodes 414, 416 and first and second resistors 420, 422. The first and second diodes 414, 416 are connected in series between the voltage supply and a base of the driver transistor 412. The first resistor 422 is connected between the emitter of the driver transistor 412 and the voltage supply line Vs. The relay transistor 410 may be an npn transistor and the driver transistor may be a pnp transistor. The switch 404 may be switchably connected between ground and the second resistor 420.

The second resistor 420 may be connected between the base of the driver transistor 412 and the switch 404. This second resistor 420 may allow an appropriate base current to flow from the voltage supply line Vs to ground when the switch is on thereby providing a base current to the driver transistor 412. The resistance of the second resistor 420 may be chosen so as to keep the leakage current from the voltage supply line Vs to ground low, whilst at the same time allowing the first and second diodes 414 and 416 to conduct. The voltage drop across the second resistor should be such that to allow the first and second diodes 414 and 416 to conduct. In this regard the second resistor 420 sets the operating conditions for the two diodes 414 and 415, but also limits any leakage currents from voltage source line Vs to ground. Each of the diodes 414 and 416 exhibit a forward voltage drop Vf. The combined forward voltage drop of the diodes 414 and 416, minus a base-emitter voltage Vbe of the pnp driver transistor 412 produce a constant voltage across the first resistor 422, thus producing a constant current on the base of transistor 410.

Hence the choice of second resistor 420 is a trade-off between minimising leakage current and providing a current that is sufficient current to switch the driver transistor 410, of the driver circuit 408 at low (for example 6 volts in automotive applications) supply voltage at the voltage supply line Vs.

The switch 404 may be any appropriate switch arranged to switchably operate the solid state relay 402. For example the switch 404 may form part of an external control circuit (not illustrated). The electrical load 406 may be connected between a collector of the relay transistor 410 and the voltage supply line Vs. This arrangement of the electrical load 406 with respect to the relay transistor 410 and the voltage supply Vs may be seen as a "low side" switching configuration. For example, during operation, the supply voltage on the voltage supply line Vs may be between 6 volts and 16.8 volts. This supply voltage range is a typical for automotive applications. However, the skilled person will appreciate that the operating principles apply for any supply voltage.

The collector of the driver transistor 412, which acts as an output of the driver circuit 408, may be connected, via a third power balancing resistor 424, to the base of the relay transistor 410. Compared with the embodiment of FIG. 3, this additional resistor third balancing resistor 424 acts to balance the power dissipation between the driver circuit 408 and the relay transistor 410. In principle the product of voltage drop, Vs minus Vbe of driver transistor 412, and the current from the driver circuit is a power dissipation loss. In order to relax the requirement for power dissipation of the driver circuit 408, this voltage drop can be divided between the third resistor 424 and driver circuit 408. By choosing a relay transistor 412 with a very high current gain hFE it is possible to operate the switching circuit 400 with low driving current from the driver circuit 408, such that power is dissipated in the relay transistor 412 and thermal heating may be distributed to the third balancing resistor 424. If too much power is dissipated in the driver circuit 408 the driver circuit 408 may deliver less current such that it may be advantageous to move power dissipation outside the driver circuit to the third balancing resistor 424.

In addition relay transistor 410 may also be made on a smaller die, saving production costs. For a given driver current the thermal losses in the driver circuit 408 and the third balancing transistor 424 and transistor 412 may be balanced. This can for example help if thermal capability of the driver circuit 408 is small, or if the driver circuit 408 and relay transistor 410 is integrated in one package then the third balancing resistor 424 may help to dissipate some of the driver current outside this package.

Operationally, the embodiment of FIG. 4 is identical to that of FIG. 3, with exception of the above mentioned power dissipating third resistor 424.

The skilled person will appreciate that each of the embodiments described above illustrate low side switching arrangements. However, embodiments may also be implemented as "high side" switching arrangements.

Figure 5:
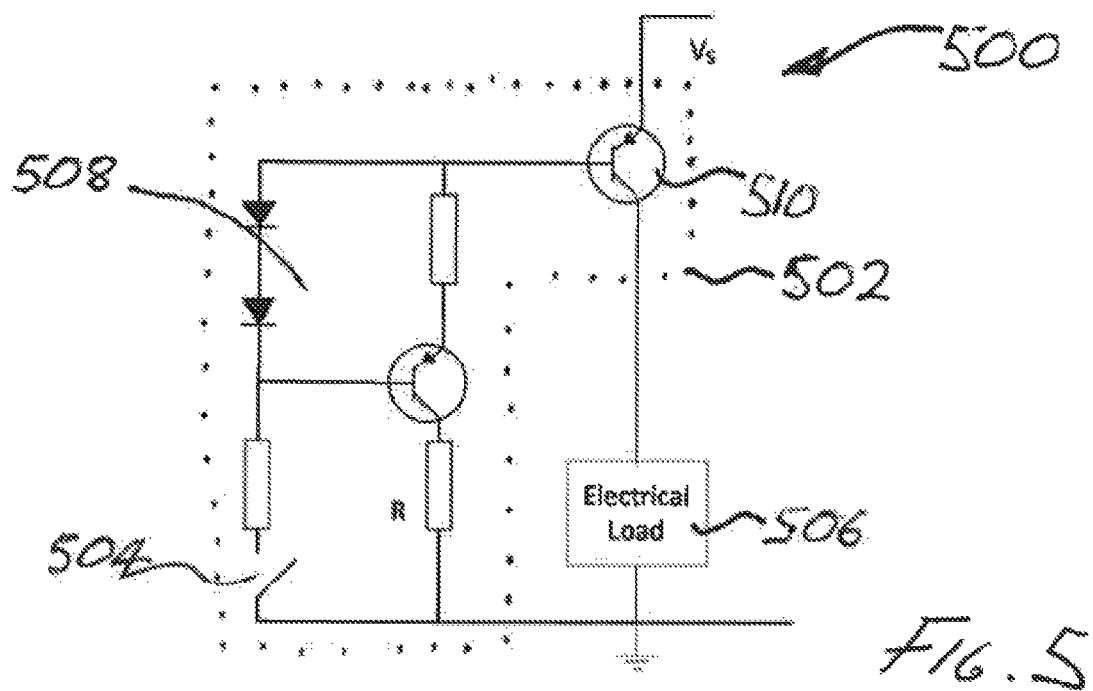
FIG. 5 illustrates a circuit diagram according to an embodiment of a high side solid state relay circuit using a constant current source.
Figure 6:
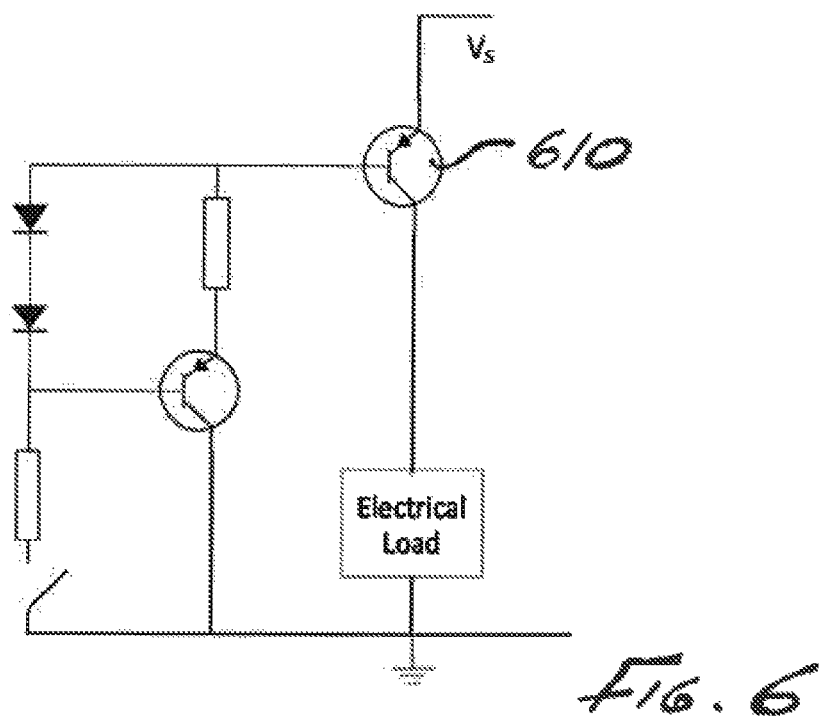
FIG. 6 illustrates a circuit diagram according to an embodiment of a high side solid state relay circuit using a constant current source.

FIGS. 5 and 6 illustrate circuit diagrams of "high side" switching circuits according to further embodiments. With specific reference to FIG. 5, the switching circuit 500 may comprise a solid state relay 502 according to an embodiment, a switch 504 and an electrical load 506 to be switchably controlled. The electrical load 506 may be switchably controlled by the solid state relay 502. The solid state relay 502 may comprise a driver circuit 508, where the driver circuit may be arranged to switchably operate a pnp relay transistor 510. The electrical load 506 and the solid state relay 502 may be powered by a voltage supply Vs. The skilled person will see that other than the pnp relay transistor 510, the structure of this embodiment is the same as that of FIG. 4 but with the arrangement of FIG. 5 configured as a high side switching arrangement.

Similarly, in the case of the embodiment of FIG. 6 the skilled person will see that other than the pnp relay transistor 610, the structure of this embodiment is converse of low side embodiment of FIG. 3.

Figure 7:
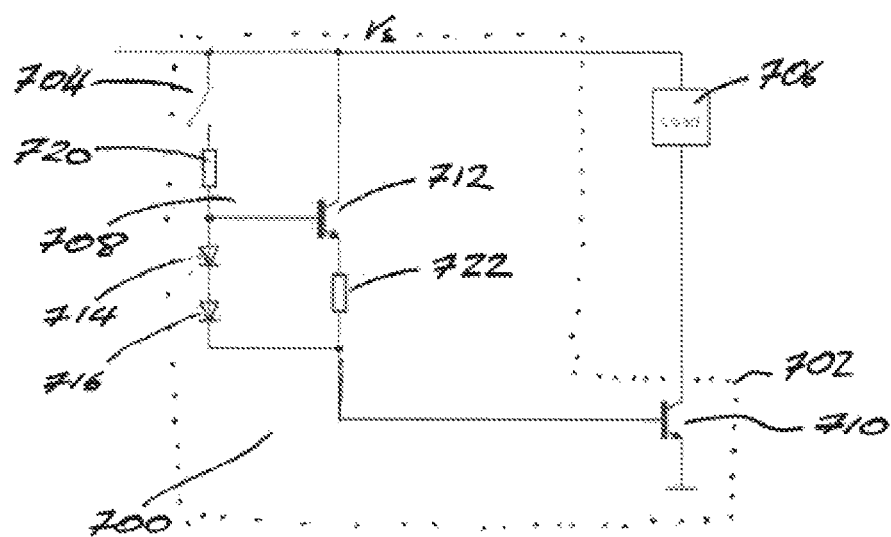
FIG. 7 illustrates a circuit diagram according to an embodiment of a low side solid state relay circuit using a constant current source.
Figure 8:
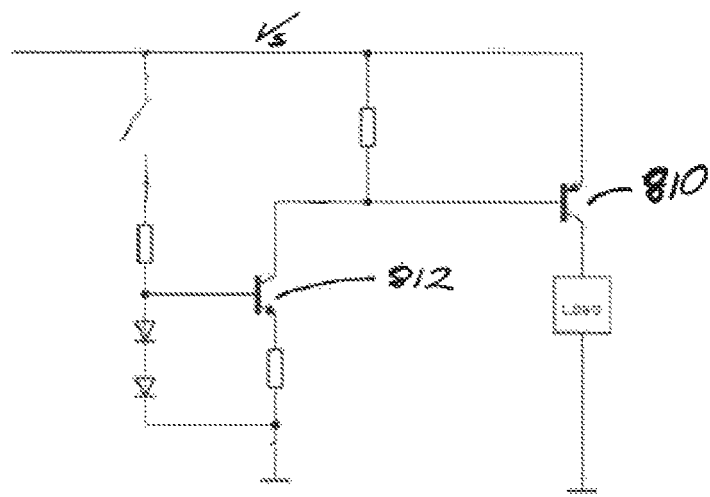
FIG. 8 illustrates a circuit diagram according to an embodiment of a high side solid state relay circuit using a constant current source.

Referring now to FIGS. 7 and 8, they illustrate respective high side and low side current controlled solid state relay circuits implemented using npn driver transistors. With respect to the arrangement of FIG. 7 the solid state relay circuit 700 may comprise a solid state relay 702 according to an embodiment, a switch 704 and an electrical load 706 to be switchably controlled. The electrical load 706 may be switchably controlled by the solid state relay 702. The solid state relay 702 may comprise a driver circuit 708, where the driver circuit 708 may be arranged to switchably operate a relay transistor 710. The electrical load 706 and the solid state relay 702 may be powered by a voltage supply line Vs.

The driver circuit 708 may comprise a npn driver transistor 712 arranged to switchably operate the relay transistor 710 in response to the switch 704 being turned on. The relay transistor 710 may be an npn transistor. The driver circuit 708 may further comprise first and second diodes 714, 716 and a first resistor 722. The first and second diodes 714, 716 are connected in series between the base of the driver transistor 712 and a collector of the relay transistor 710. The first resistor 722 is connected between the emitter of the driver transistor 712 and the collector of the relay transistor 710.

A second resistor 720 may be connected between the base of the driver transistor 712 and the switch 704. This second resistor 720 may allow an appropriate base current to flow from the voltage supply line Vs to ground. The resistance of the second resistor 720 may be chosen so as to keep the leakage current from the voltage supply line Vs to ground low, whilst at the same time allowing the first and second diodes 714 and 716 to conduct.

The switch 704 may be any appropriate switch arranged to switchably operate the solid state relay 702. For example the switch 704 may form part of an external control circuit (not illustrated). The switch 704 may be switchably connected between the voltage supply line Vs and the second resistor 720. The electrical load 406 may be connected between a collector of the relay transistor 710 and the voltage supply line Vs. This arrangement of the electrical load 706 with respect to the relay transistor 710 and the voltage supply line Vs may be seen as a "low side" switching arrangement.

The embodiment of FIG. 8 illustrates a "high side" switching arrangement utilising an npn driver transistor 812. The skilled person will appreciate that the operation of this configuration is similar to that of FIG. 7, with the exception that the relay transistor 810 is in a high side arrangement.

The arrangement of npn driver transistors in the embodiments of FIGS. 7 and 8 may provide improved linearity at high operating currents, typically above 50 mA.

Figure 10:
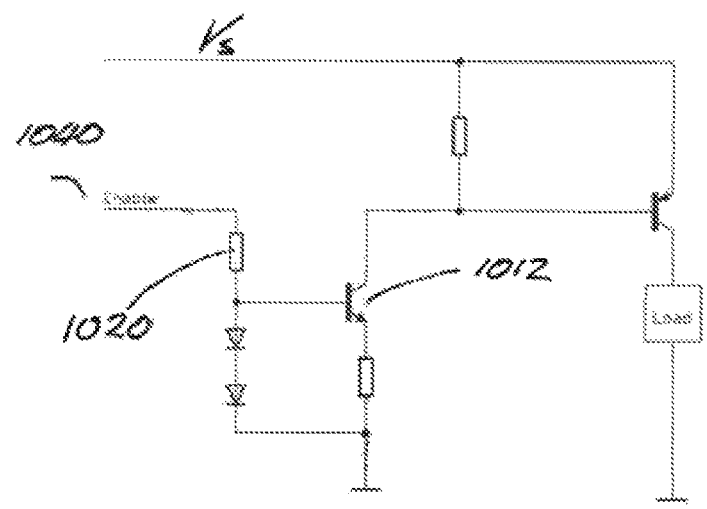
FIG. 10 illustrates a circuit diagram according to an embodiment of a high side solid state relay circuit using a constant current source.
Figure 9:
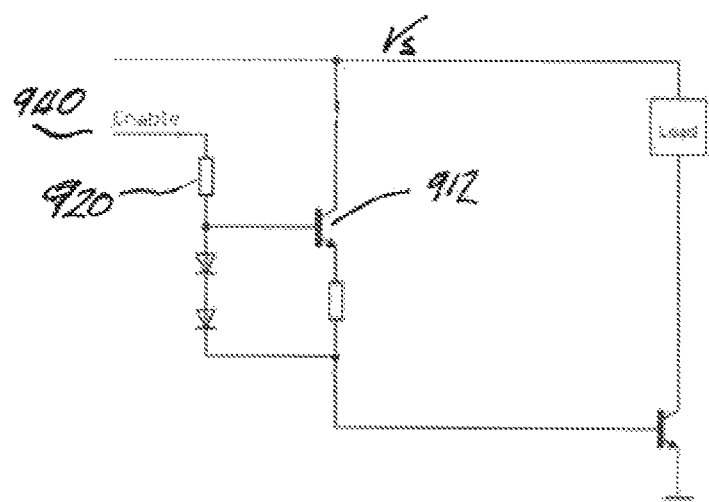
FIG. 9 illustrates a circuit diagram according to an embodiment of a low side solid state relay circuit using a constant current source.

FIGS. 9 and 10 illustrate alternative embodiments to those presented in FIGS. 7 and 8. In the embodiments of FIGS. 9 and 10 the respective npn driver transistors 912, 1012 are connected to respective enable lines 940, 1040. The respective enable lines 940, 1040 allow for control of the solid state relay by a voltage separate to the voltage supply Vs and as a result it is possible to have a constant current. During operation a constant enable voltage (for example a 5V or 3.3V output of a control IC (not illustrated)) provided on the enable line gives constant voltage across the diodes even when the supply voltage $V_S$ varies within the range of, for example 6V to 16.8V. In this way the variation of the forward voltage Vf of the two diodes with varying $V_S$ is less and the constant output current remains stable. Furthermore, in order to achieve high output current from the driver circuit, for example 100 mA. If the transistor 912, 1012 has a current gain, $h_{FE}$, of 200 the base current into transistor 912, 1012 will be 500 μA. Therefore the choice of second resistor 920, 1020 and the voltage on the enable line needs to be such that the voltage drop across second resistor 920, 1020 is greater than twice the combined forward voltage drop of the diodes, otherwise the diodes will not conduct Also the base current of the transistor 912 1012 should be such that enough current remains for the diodes to conduct. Therefore the choice of second resistor 920, 1020 and the voltage on the enable line needs to be such the voltage drop across the second resistor 920, 1020 allows the diodes to conduct. Second resistor 920,1020 may therefore be chosen based on the enable voltage such that the driver transistor 912, 1012 can be operated correctly, that is provide enough base current to operate.

By choosing an appropriate resistance value for resistor 920, 1020, the enable voltage can provide sufficient current to allow the diodes to conduct and still deliver enough base current for transistor 912, 1012. The driver circuit will then deliver constant current.

The enable voltage may typically be constant compared to the supply voltage. In applications such automotive the supply voltage may vary between 6 and 16.8 volts. Because of the variability of the supply voltage there may be circumstances where the supply voltage drops below an optimum level and thus the driver circuit may not switch the relay transistor. By using a constant enable voltage, problems with the variation in supply voltage can be eliminated.

The enable line may be controlled/provided by a microcontroller or other appropriate control circuit (not illustrated).

Based on the above disclosure, the skilled person will appreciate that the driver circuit according to embodiments may be arranged as discrete components. These discrete components by may be arranged on a standalone printed circuit or as part of a larger system. In addition the driver circuit may be arranged on an integrated circuit (IC) either as a standalone IC or as part of a larger IC or comprising one or more discrete chips assembled in one package. The may be components integrated together including the switch, or as mentioned the switch may be form part of an external control circuit (not illustrated). The skilled person will also appreciate that the driver circuit may be packaged such that it has a form factor identical to that of known electromagnetic relays. Alternatively, due to the ability to fabricate electronic components such as the transistors, resistors and diodes of the type discussed above on micron or even submicron scales the solid state relay circuits of the types described may a smaller footprint and weigh less than conventional electromechanical type relays.

Compared to electro-mechanical relays the solid state relay circuits according to embodiments can be switched more rapidly since there is no mechanical limit on switching speed of the relay. This results in solid state relay circuits which are capable of being controlled by PWM. Therefore, the power to the load can be regulated by means of a varying duty cycle, that is, the percentage of the switching period where the load is on. Controlling the load by PWM, gives the advantage of controlling the switching speed of the load. This will give a better control (from stop to full speed) of DC motors used in electrical fans, window lifters and so forth. Thus making them suitable for low power operation in internet of things applications such as home automation. Furthermore, and because of PWM and low power operation the solid state relays according to embodiments can potentially save energy, compared to electro-mechanical relays, which is a key driver for low $CO_2$ emission. Moreover the in-rush current at switching on of the relay will be lower for a solid state relay resulting in lower power consumption.

Furthermore, by modulating a duty cycle of the PWM gradually from low to high and low to high, the hard switching of a mechanical relay, which results in electromagnetic Interference (EMI), can be replaced by solid state (or soft) switching which allows for smooth turn on and turn off with appreciably less EMI and also less audible noise which is typically generated by the mechanical operation of electromechanical relays. Indeed, over time, electro-mechanical relays can produce so-called contact bounces, arcing as a result of mechanical wear thus resulting in increased EMI. However, solid state relays according to embodiments will not wear out over time since they have no moving mechanical parts. This has distinct advantages in areas such as in vehicle networking where electromagnetic interference should be minimised so as not to cause safety critical interference with vehicle controls. In each of the embodiments presented above the solid state relays may current controlled thus in term of control providing a like for like replacement of current controlled electromechanical relays.

In the foregoing discussion, and unless otherwise stated, the terms connected or connection refer to electrical connections. Particular and preferred aspects of the invention are set out in the accompanying independent claims. Combinations of features from the dependent and/or independent claims may be combined as appropriate and not merely as set out in the claims.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A solid state relay circuit for switching an electrical load, the solid state relay circuit comprising:
   a relay transistor comprising a control terminal; and
   a driver circuit comprising a constant current source, the constant current source comprising:
   a driver transistor comprising a control terminal, an input terminal and an output terminal;
   a first resistor connected to the input terminal of the driver transistor;
   a balancing resistor connected between the output terminal of driver transistor and a control terminal of relay transistor; and
   at least one diode connected to the control terminal of the driver transistor,
   wherein the diode and the driver transistor are arranged to produce a constant voltage across the first resistor,
   wherein the output terminal of the driver transistor of the driver circuit is operably connected to the control terminal of the relay transistor so that the output of the driver transistor switchably operates the relay transistor, and
   wherein the relay transistor is configured and arranged to switchably operate the electrical load.

2. The solid state relay circuit of claim 1, wherein the input terminal of the driver transistor is an emitter terminal, the control terminal of the driver transistor is a base terminal, the output terminal of driver transistor is a collector terminal, and the control terminal of relay transistor is a base terminal.

3. The solid state relay circuit of claim 1, wherein the input terminal of the driver transistor is a collector terminal, and wherein the control terminal of the driver transistor is a base terminal, the output terminal of driver transistor is an emitter terminal, and the control terminal of relay transistor is a base terminal.

4. The solid state relay circuit of claim 2, wherein the driver transistor is a pnp transistor and the relay transistor is a npn transistor.

5. The solid state relay circuit of claim 2, wherein the driver transistor is a pnp transistor and the relay transistor is a pnp transistor.

6. The solid state relay circuit of claim 3, wherein the driver transistor is a npn transistor and the relay transistor is a npn transistor.

7. The solid state relay circuit of claim 3, wherein the driver transistor is a npn transistor and the relay transistor is a pnp transistor.

8. The solid state relay circuit of claim 1, wherein the constant current source further comprises a second resistor configured to allow a plurality of the diodes to conduct and to provide base current to the driver transistor.

9. The solid state relay circuit of claim 1, wherein the driver transistor is a low power transistor and the relay transistor is a high power transistor.

10. The solid state relay circuit of claim 6, further comprising an enable line, wherein the enable line is configured and arranged to switchably control the driver circuit.

11. The solid state relay circuit of claim 10, wherein the enable line is controlled by a pulse width modulation circuit.

12. The solid state relay circuit of claim 10, wherein the enable line is connected to the control terminal of the driver transistor.

13. The solid state relay circuit of claim 7, further comprising an enable line, wherein the enable line is configured and arranged to switchably control the driver circuit.

14. The solid state relay circuit of claim 13, wherein the enable line is controlled by a pulse width modulation circuit.

15. The solid state relay circuit of claim 13, wherein the enable line is connected to the control terminal of the driver transistor.

16. The solid state relay circuit of claim 1, further comprising a switch, wherein the switch is configured and arranged to switchably control the driver circuit.

17. The solid state relay circuit of claim 16, wherein the switch is controlled by a pulse width modulation circuit.

18. The solid state relay circuit of claim 16, wherein the switch line is connected to the control terminal of the driver transistor.

19. A solid state relay circuit for switching an electrical load, the solid state relay circuit comprising:
   a relay transistor comprising a control terminal; and
   a driver circuit comprising a constant current source, the constant current source comprising:
   a driver transistor comprising a control terminal, an input terminal and an output terminal;

a first resistor connected to the input terminal of the driver transistor;

a balancing resistor connected between the output terminal of driver transistor and a control terminal of relay transistor; and at least one diode connected to the control terminal of the driver transistor, wherein the diode and the driver transistor are arranged to produce a constant voltage across the first resistor, wherein the output terminal of the driver transistor of the driver circuit is operably connected to a control terminal of the relay transistor so that the driver circuit is configured and arranged to switchably operate the relay transistor in response to operation of a switch, wherein the relay transistor is configured and arranged to switchably operate the electrical load, and wherein the input terminal of the driver transistor is an emitter terminal, the control terminal of the driver transistor is a base terminal, the output terminal of driver transistor is a collector terminal, and the control terminal of relay transistor is a base terminal.

\* \* \* \* \*